United States Patent [19]

Sanders

[11] Patent Number: 5,327,106
[45] Date of Patent: Jul. 5, 1994

[54] LOCAL OSCILLATOR WITH REDUCED HARMONIC

[75] Inventor: Stuart B. Sanders, Kokomo, Ind.

[73] Assignee: Delco Electronics Corp., Kokomo, Ind.

[21] Appl. No.: 11,925

[22] Filed: Feb. 1, 1993

[51] Int. Cl.[5] .................. H03B 5/12; H03B 1/04; H03L 5/00
[52] U.S. Cl. .................. 331/109; 331/117 FE; 331/177 V
[58] Field of Search ...... 331/117 R, 117 FE, 116 FE, 331/36 C, 62, 105, 109, 167–171, 175, 177 V, 182

[56] References Cited

U.S. PATENT DOCUMENTS

| | | | |
|---|---|---|---|
| 3,137,826 | 6/1964 | Boudrias | 331/109 X |
| 3,513,408 | 5/1970 | McGee | 331/117 FE X |
| 3,624,541 | 11/1971 | Lundstrom | 331/109 X |
| 3,624,555 | 11/1971 | Klein | 331/107 |
| 3,735,287 | 5/1973 | Lowe | 331/106 |
| 3,939,644 | 2/1976 | Wolf | 331/116 FE X |
| 4,044,317 | 8/1977 | Newell et al. | 331/116 |
| 4,059,812 | 11/1977 | Procter | 331/1 |
| 4,158,182 | 6/1979 | Washburn | 331/117 FE |
| 4,255,710 | 3/1981 | Weber | 324/328 |
| 4,484,153 | 11/1984 | Borras et al. | 331/10 |
| 4,785,263 | 11/1988 | Kaitenecker et al. | 331/117 FE |
| 4,935,706 | 6/1990 | Schenberg | 331/11 |
| 5,028,889 | 7/1991 | Fedan | 331/183 |
| 5,072,195 | 12/1991 | Graham et al. | 331/2 |
| 5,191,302 | 3/1993 | Rossnick | 331/182 X |

FOREIGN PATENT DOCUMENTS 0085129  6/1980  Japan .................. 331/117 FE

OTHER PUBLICATIONS

Strange, M. G., "Filterlevels Output Swing of Wien--bridge Oscillators"; *Electronics;* Jan. 4, 1979; vol. 52, No. 1; pp. 134–135.
Helfrick, A. D., "MOSFETs For Tubes"; *QST* for; Dec., 1969; pp.28–30.
"Some Applications of Field-Effect Transistors"; *Electronic Engineering;* Sep. 1969; pp. 18–23.

*Primary Examiner*—David Mis
*Attorney, Agent, or Firm*—Anthony Luke Simon; Jimmy L. Funke

[57] ABSTRACT

An apparatus suitable for use as a local oscillator is disclosed, which includes (a) a tank circuit operatively associated with an FET to generate a fundamental frequency oscillating signal at an output of the FET and (b) a bi-directional clamp circuit coupled at a junction between the tank circuit and a gate of the FET to limit a swing of the gate of the FET, preventing the gate of the FET from entering either a saturation region or a cut-off region. The bi-directional clamp includes a first diode coupled to allow positive current to flow to the junction and a second diode coupled to allow positive current to flow away from the junction. The oscillator produces an output with a reduced level of radiation-prone harmonics.

5 Claims, 5 Drawing Sheets

LOCAL OSCILLATOR WITH REDUCED HARMONIC

This invention relates to oscillator circuits and more particularly to a field effect transistor oscillator with reduced harmonics.

BACKGROUND OF THE INVENTION

Oscillator circuits produce periodic electrical waveforms, such as sine waves, at a frequency determined by intrinsic component values. Oscillators are widely used in electronic applications, especially in radio receivers, as sources of radio frequency energy. Radio receivers oscillators, called local oscillators, operate in the internal mixer circuits, which convert the incoming radio signals up or down to a fixed intermediate frequency to be amplified and detected and later turned into an audible signal. Typical oscillators that operate in high frequencies, such as in the radio frequency range, tend to generate unwanted electrical noise. This noise is harmonically related to the frequency of the local oscillator and can travel outward from the receiver to interfere with other nearby radios, cellular phones, citizen band radios, etc.

Reductions in these unwanted radiated emissions minimizes the chance of interference with other nearby devices, and, such reductions, may be required to meet radiated emissions limitations established by regulatory agencies both in the U.S. and abroad. Known methods to reduce radiated emissions include adding metal shielding and filtered connectors to the unit in which the oscillator is employed. In general, this is an expensive proposition due to a proliferation in hardware required.

FIG. 1 shows an ideal sine wave signal 12, having a singular spectral frequency 14, shown in FIG. 2. With the ideal sine wave shown in FIGS. 1 and 2, there are no unwanted harmonics that radiate as noise.

FIG. 3 illustrates a typical oscillator output as deformed sine wave 16. FIG. 4 shows the spectral plot of deformed sine wave 16, illustrated by plots 18 in the graph shown. Frequency $f_0$ is the desired frequency of sine wave 16 and frequencies $f_1$-$f_n$ are the unwanted harmonics, which, in the absence of preventative measures, radiate from the oscillator as unwanted emissions.

Referring to FIG. 5, a typical prior art local oscillator circuit is shown. The frequency of the circuit is controlled by inductor 20, capacitor 22 and varactor 24, comprising the tank 21. The frequency of the oscillator is tuned by the voltage level set on line 49, which is coupled to the tuning input of varactor 24 by resistor 48 and capacitor 50 as shown.

Tank 21 is coupled to transistor 34 via capacitors 26 and 28. Transistor 34 has its base biased into the active region by resistors 30 and 32 and has its collector biased high by resistor 36 coupled to the power supply. Capacitor 42 filters current spikes from the power supply. The output of transistor 34 is fed back to the tank circuit via inductor 38 and resistor 40, as shown. The output signal at the collector of transistor 34 is filtered by inductor 44 and capacitor 46 and output for its desired use on line 45.

FIG. 6 shows the spectral response 54 of the prior art local oscillator shown in FIG. 5 and compares the spectral response 54 to the maximum desired harmonic noise level, line 52. As can be seen, the prior art oscillator consistently exceeds level 52, especially at the high frequencies that fall into cellular telephone frequency ranges. One known method to reduce the harmonic emissions of FET oscillators is to provide a diode across the gate of the oscillator to clamp the gate.

BRIEF DESCRIPTION OF THE INVENTION

This invention advantageously provides a new FET oscillator with reduced harmonic emissions. Advantageously, this invention eliminates the necessity of shielding local oscillator circuits. Advantageously, the apparatus of this invention eliminates the necessity of special filters to reduce radiated emissions of FET oscillators. Advantageously the apparatus of this invention provides an FET oscillator with a reduced likelihood of interfering with other nearby electronic equipment, such as radios, citizen band radios, cellular telephones, etc.. Advantageously, the apparatus of this invention provides an FET oscillator usable in locations in which radiated emissions are tightly regulated. Advantageously the apparatus of this invention reduces radiated emission levels in the cellular telephone range by 50 decibels.

Advantageously, the apparatus of this invention achieves these advantages through implementation of a bi-directional clamp on the gate voltage of the FET of the oscillator and by implementing circuitry to limit the rate of change of the Miller capacitance of the oscillator.

Structurally, the apparatus of this invention comprises a tank circuit coupled between a gate and a drain of an FET, and a bi-directional clamping means coupled to the gate of the FET for limiting the total swing of the FET gate. The bi-directional clamping circuit comprises first and second diodes coupled between the gate and ground. The first diode is coupled to allow current flow toward the gate and the second diode is coupled to allow current flow away from the gate, wherein the two diodes limit the voltage swing at the gate of the FET to $+/-0.7 + A$ volts.

A more detailed description of this invention is set forth below.

DETAILED DESCRIPTION OF THE INVENTION

Figure 1:
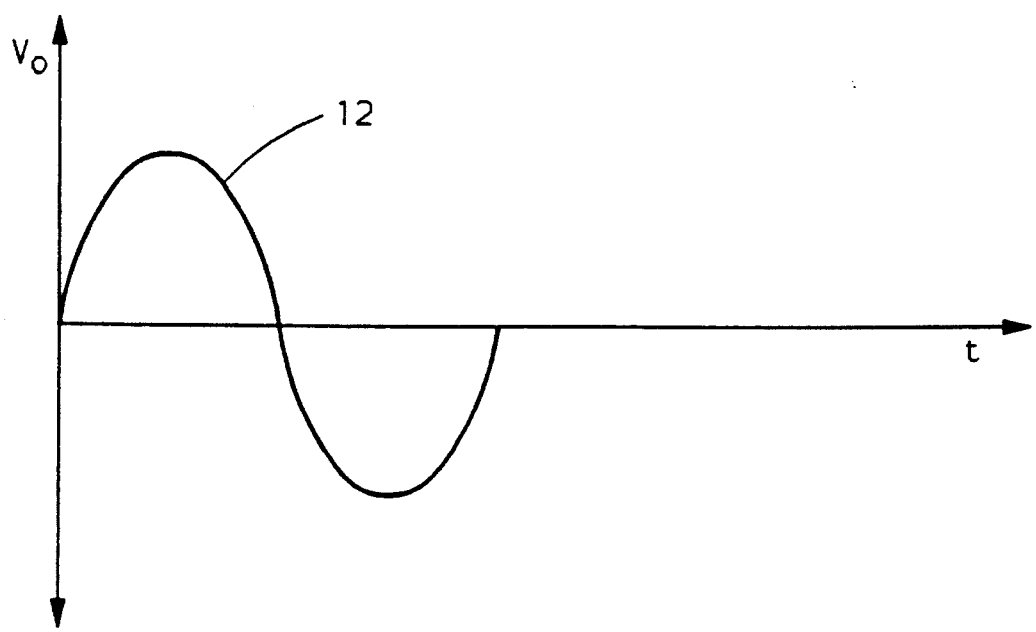
FIG. 1 illustrates an ideal sine wave.
Figure 2:
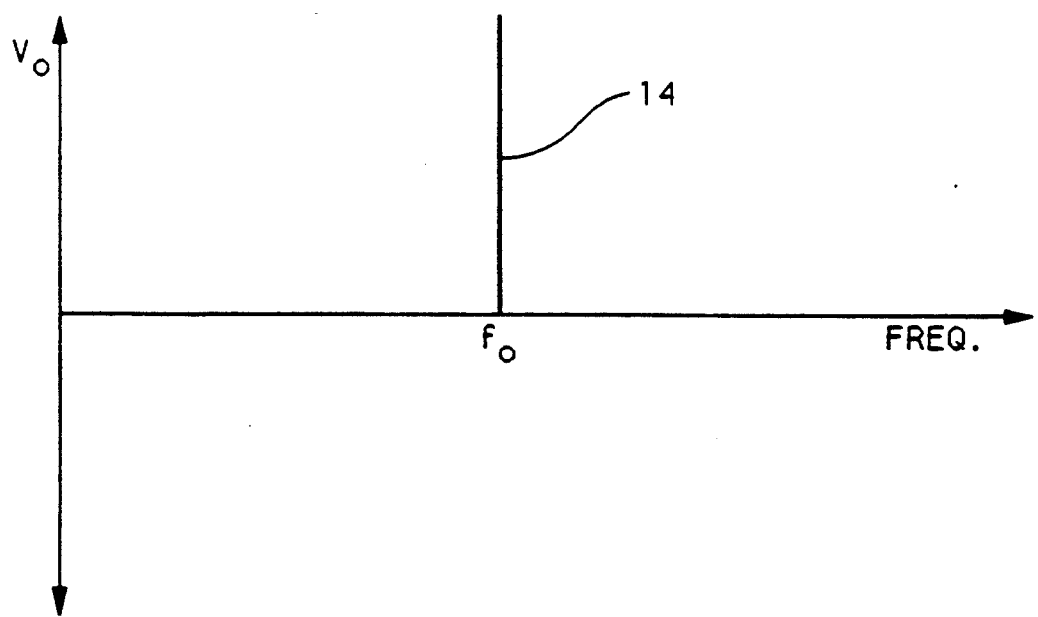
FIG. 2 illustrates the spectral plot of an ideal sine wave.
Figure 3:
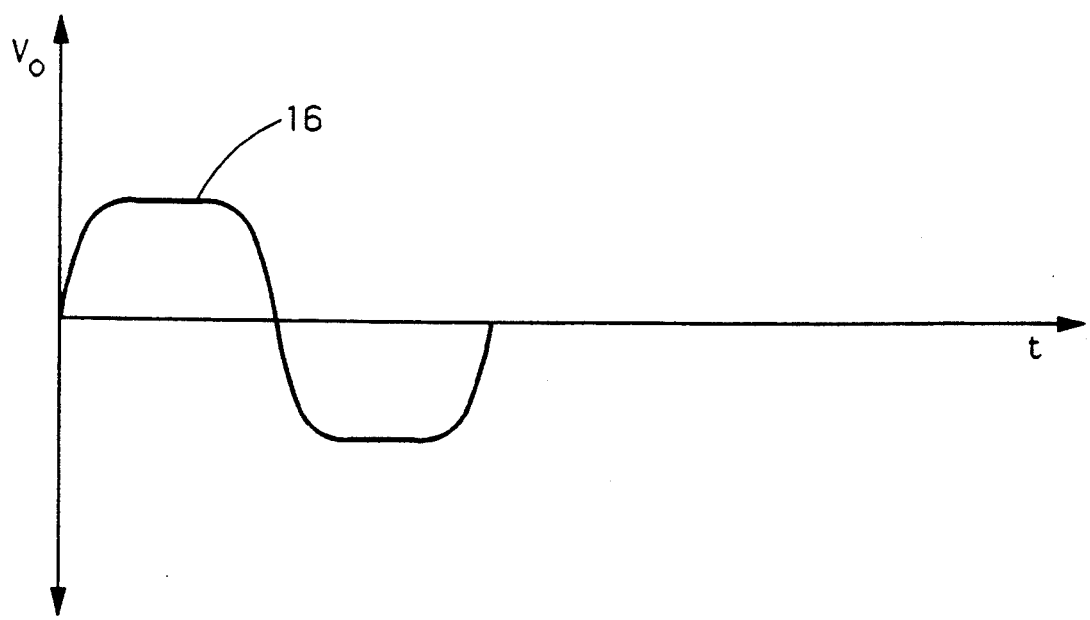
FIG. 3 illustrates a typical sine wave output of an oscillator circuit.
Figure 4:
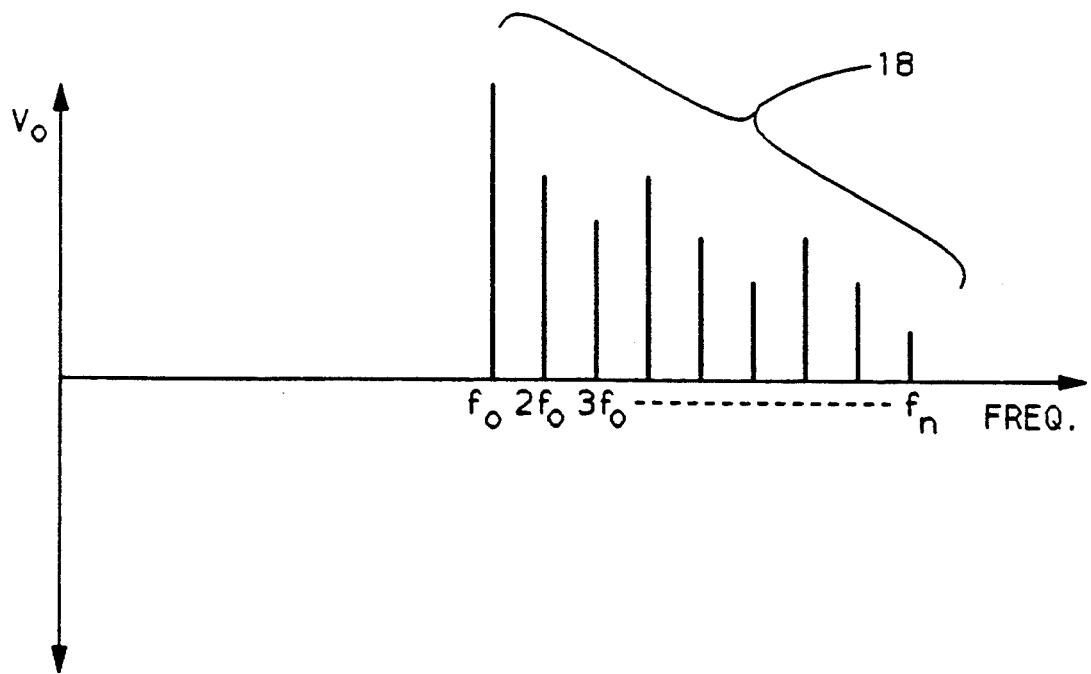
FIG. 4 illustrates the spectral plot of the typical sine wave of output of FIG. 3.
Figure 5:
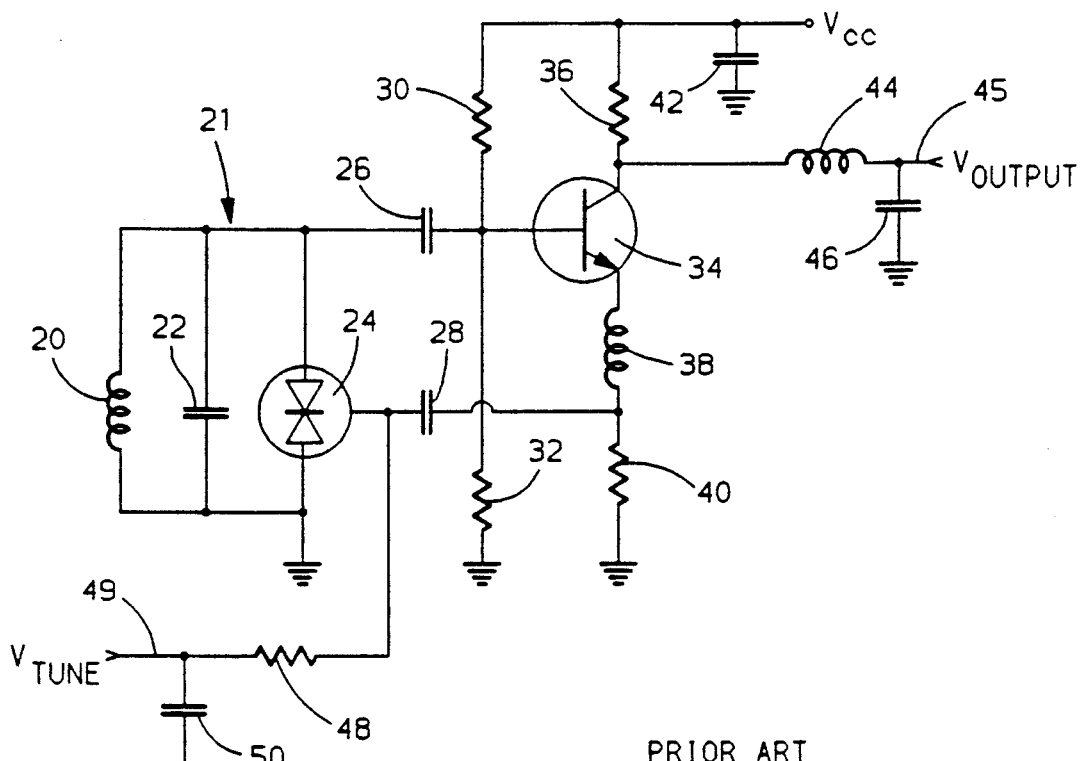
FIG. 5 illustrates a prior art oscillator circuit.
Figure 7:
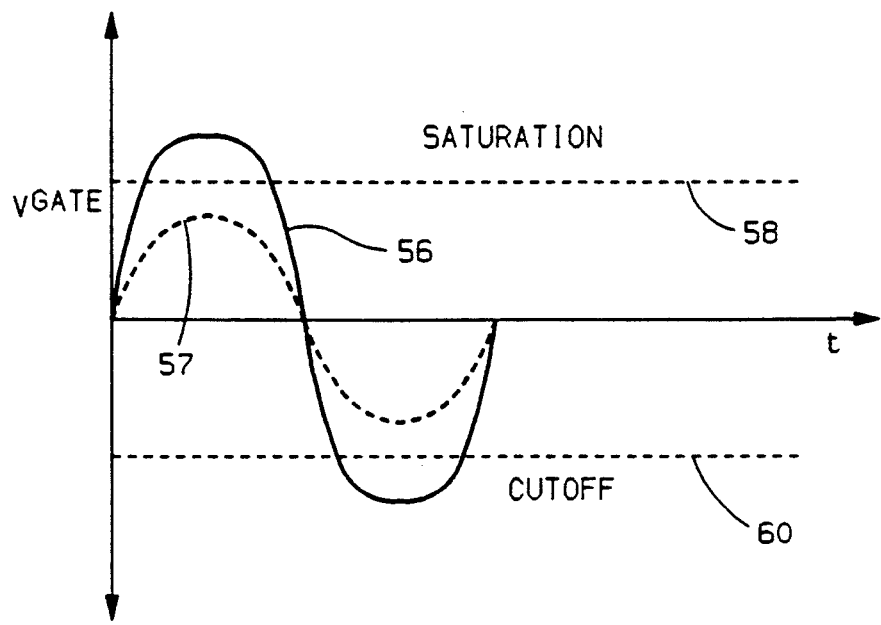
FIG. 7 illustrates sine wave deformation in oscillator circuits.

Referring to FIG. 7, trace 56 shows an ideal sine wave superimposed over the operating region of a typical FET, which is active between its cut-off, represented by level 60, and its saturation point, represented by level 58. The sine wave that enters into these regions, such as trace 56, becomes deformed as shown by the prior art FIG. 3.

According to this invention, the sine wave 57 at the input of the FET, maintains the FET in its active linear region, thereby decreasing distortion of the sine wave and thereby reducing the generation of radiation-prone harmonics.

Figure 8:
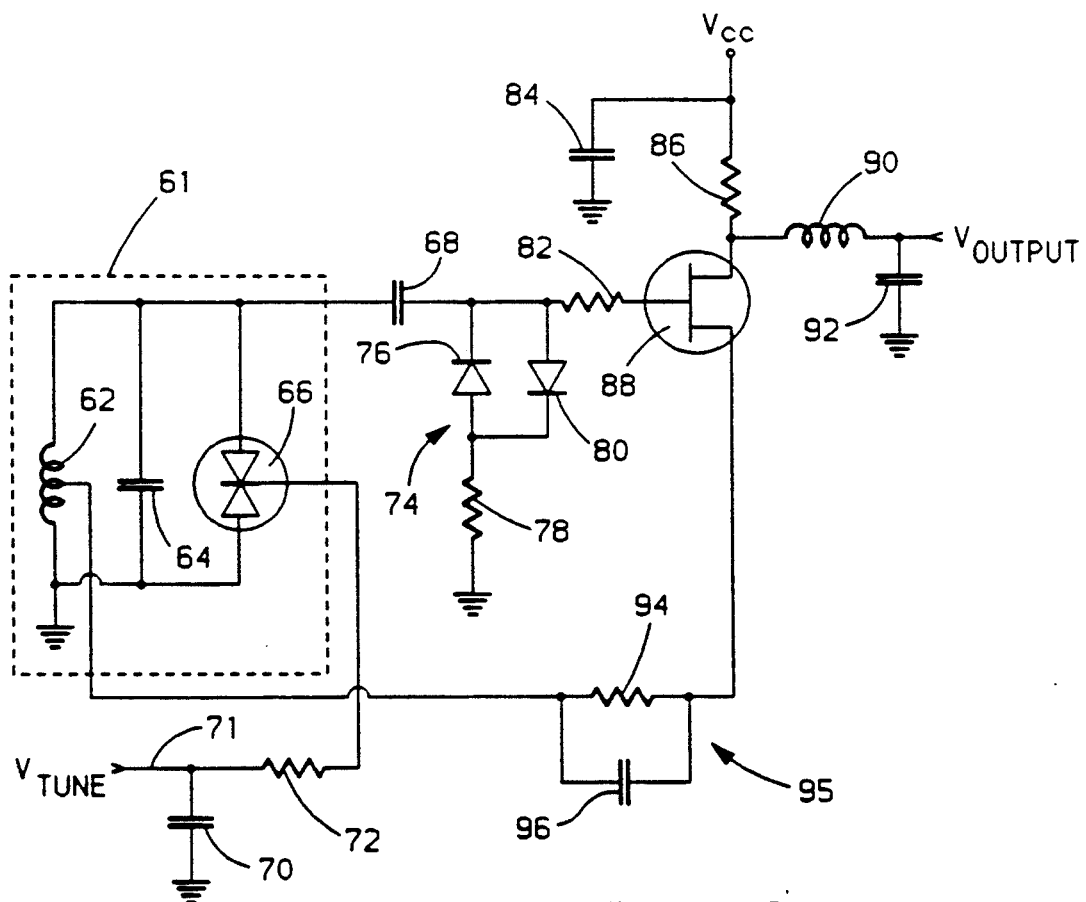
FIG. 8 illustrates one implementation of the apparatus of this invention.

Referring to the example shown in FIG. 8, the FET oscillator shown according to this invention, includes inductors 62 and 90, capacitors 64, 68, 70, 84, 92 and 96, varactor 66, resistors 72, 78, 82, 86 and 94, diodes 76 and 80 and FET 88. Inductors 62, capacitor 64 and varactor 66 comprise a resonator tank 61 tuned by the voltage input on line 71, coupled to the tuning input of varactor 66 via capacitor 70 and resistor 72, as shown. The drain of FET 88 is coupled via filter 95, comprising resistor 94 and capacitor 96, to the tap in inductor 62, as shown, to provide an offset between the drain of FET 88 and the system ground.

The output of resonator circuit is coupled via capacitor 68 to the bi-directional clamp circuit 74. Bi-directional clamp circuit 74 comprises diodes 76 and 80 connected in parallel as shown between resistor 82 and resistor 78. Diode 76 allows positive current to flow toward the drain of FET 88 and diode 80 is connected to allow positive current to flow away from the drain of FET 88. The two diodes 78, 80 connected to the drain of FET 88, as shown, form a bi-directional clamp allowing the total voltage swing to be defined as $+/-0.7+A$ volts, where the constant in A is determined by the value of resistor 78. If resistor 78 is omitted, i.e., $R_{78}=0$ Ohms, then the maximum swing is $+/-0.7$ volts. Nominally, resistor 78 ranges from 75 to 2K ohms.

In operation, the diodes 76 and 80 do not conduct until they reached the "knee" in their current to voltage curve, at which point they turn on and shunt the tank through resistor 78. This effectively lowers the tank circuits loaded Q and the circuit gain. By adjusting resistor 78, clamping provided by diodes 76 and 80, in series with resistor 78, maintains FET 88 in its active region, represented by trace 57 in FIG. 7, and eliminates harmonics generated by taking FET 88 repeatedly into saturation and cut-off modes.

Resistor 82 is added to couple the tank 61 to the gate input of FET 88 and operates to improve circuit linearity by limiting the Q of the varactor, which characteristically has a non-linear junction capacitance. The value of resistor 82 controls the charging rate and discharging rate of varactor 66, eliminating the harmonics that would otherwise be created by sudden charging and discharging of varactor 66.

The output at the source of FET 88 is filtered by inductor 90 and capacitor 92 and may be used in electronic systems without requiring shielding of the oscillator shown and without requiring special filter connections. Additionally, by reducing the generation of harmonics as achieved by the apparatus shown in FIG. 8, there is no necessity to reduce conductor lengths by implementing a two-sided circuit board design.

Figure 6:
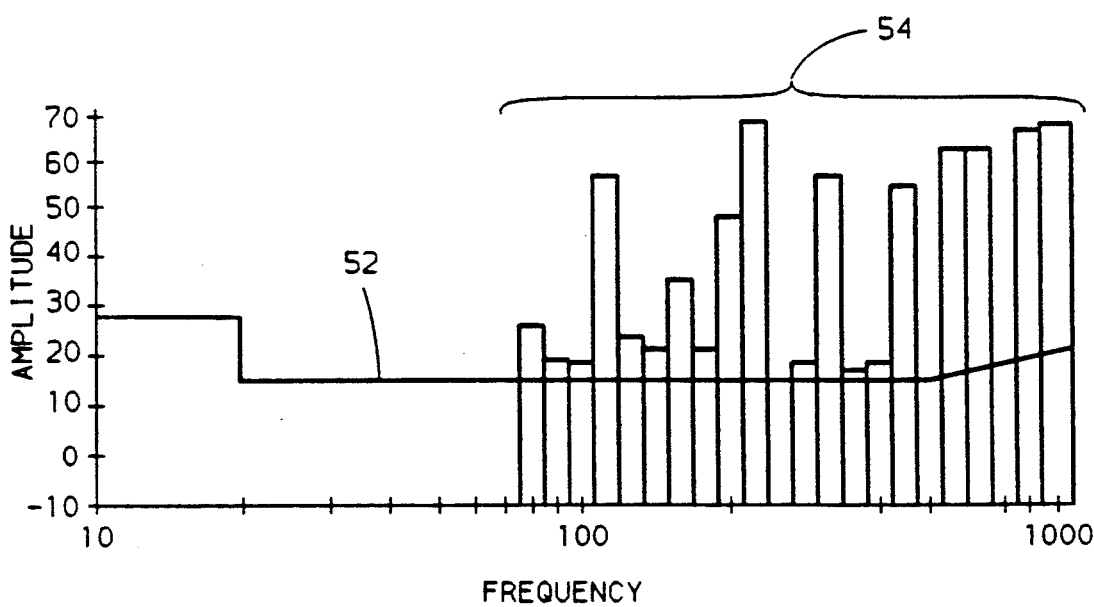
FIG. 6 illustrates the spectral plot of the prior art oscillator circuit of FIG. 5.
Figure 9:
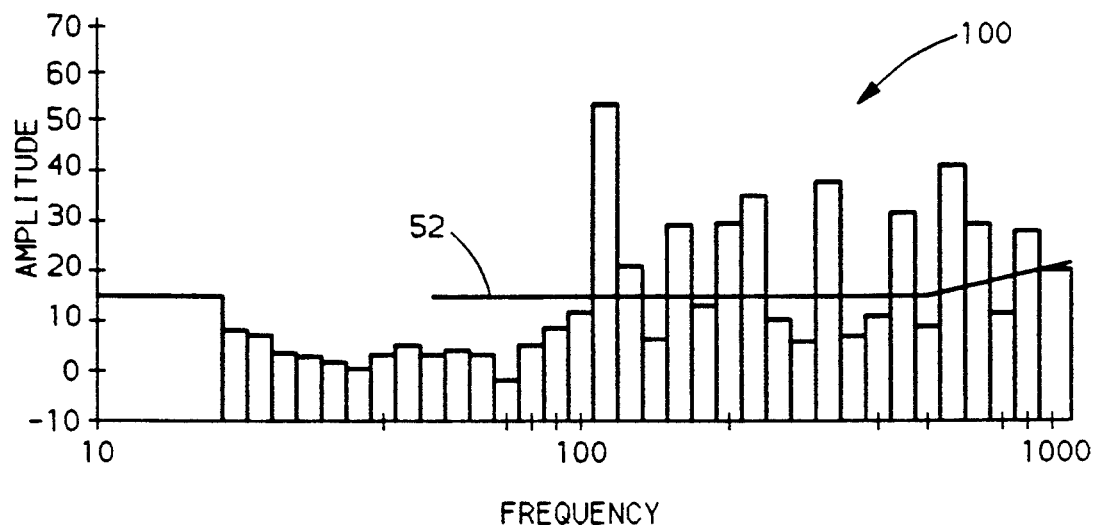
FIG. 9 illustrates the improve spectral response of the apparatus of this invention.

FIG. 9 shows the spectral plot of the harmonic frequencies generated by the oscillator shown in FIG. 8 and the relationship with the target output 52. A comparison of FIG. 9 and FIG. 6, clearly shows that the apparatus of this invention drastically decreases the broadcastable harmonics generated by the oscillator.

Figure 10:
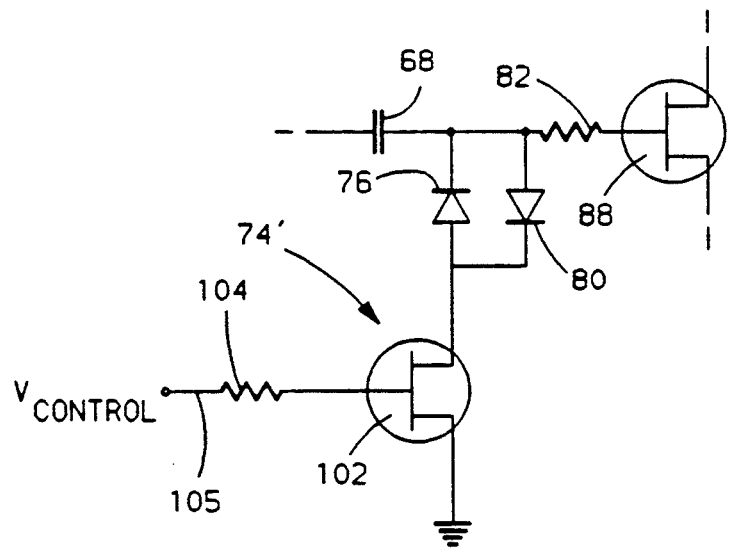
FIG. 10 illustrates a second implementation of the apparatus of this invention.

Referring to FIG. 10, a variation on the bi-directional clamp 74' is shown. Resistor 78 in FIG. 8 has been replaced with FET 102, which operates to vary the effective resistance between the diodes 76 and 80 and ground by varying the gate voltage level provided on line 105 and coupled to the gate via resistor 104. This circuit allows the signal on line 105 to control the setting of the clamp circuit 74' to provide maximum allowable swing while maintaining minimum radiation of harmonics.

The above-described implementations of this invention are example implementations and are not meant to be limiting on the scope of this invention. Moreover, various improvements and modifications to this invention may occur to those skilled in the art and such improvements and modifications will fall within the scope of this invention as set forth below.

The embodiments of the invention in which an exclusive property or privilege is claimed are defined as follows:

1. An apparatus comprising:
   a field effect transistor (FET) having a source, a gate, and a drain;
   tank circuit means coupled to the gate and drain of the FET for causing a fundamental frequency oscillating signal to be generated at the source of the FET; and
   a bi-directional clamp circuit having first and second diodes connected in parallel, each diode allowing current flow in a direction opposite to current flow in the other diode, the bi-directional clamp circuit coupled to the gate of the FET to limit a swing of a gate voltage of the FET, preventing the gate voltage of the FET from entering a saturation region and a cut-off region.

2. The apparatus set forth in claim 1 also comprising a resistor in series with the gate of the FET and the tank circuit means which is operative to reduce maximum charging and discharging current of the tank circuit means, thereby reducing a generation of radiation-prone harmonics.

3. The apparatus set forth in claim 1 also comprising a resistor connected in series with the bi-directional clamp and ground, wherein the swing of the gate voltage of the FET is equal to $+/-0.7+$ A volts and wherein A is proportional to the resistance of the resistor.

4. The apparatus set forth in claim 1 also comprising a transistor having a collector, a base, and an emitter, wherein the collector is coupled to the bi-directional clamp and the emitter is coupled to ground, and a base voltage of the transistor controls the swing of the gate voltage of the FET.

5. An apparatus comprising:
   (a) a tank circuit including, in parallel, an inductor, a capacitor and a tunable varactor, the inductor having a tap;
   (b) a field effect transistor (FET) having a source, a gate and a drain;
   (c) a filter circuit coupling the tap in the inductor to the drain of the FET, the filter circuit comprising, in parallel, a resistor and a capacitor;
   (d) a resistor coupling the gate of the FET to an output of the tank, a first end of the resistor connected to the output of the tank at a first node and a second end of the resistor connected to the gate of the FET at a second node;
   (e) a bi-directional clamp circuit having first and second diodes connected in parallel, each diode allowing current flow in a direction opposite to current flow in the other diode, the bidirectional clamp coupled between the first node and ground; and
   (f) a circuit output coupled to the FET source, at which is output an oscillator output signal having a low level of radiation-prone harmonics.

* * * * *